(12) United States Patent
Zhang et al.

(10) Patent No.: US 6,806,542 B1
(45) Date of Patent: Oct. 19, 2004

(54) ELECTRONIC DEVICE HAVING A FILLED DIELECTRIC MEDIUM

(75) Inventors: Jie Zhang, Buffalo Grove, IL (US); Anindya Dasgupta, Hillsboro, OR (US); Daniel Gamota, Palatine, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/609,999

(22) Filed: Jun. 30, 2003

(51) Int. Cl.$^7$ .......................... H01L 29/76; H01L 29/94; H01L 31/062; H01L 31/113; H01L 31/114

(52) U.S. Cl. .................. 257/411; 257/410; 257/532

(58) Field of Search .................. 257/410, 411, 257/532, 535

(56) References Cited

U.S. PATENT DOCUMENTS

| | | | | | |
|---|---|---|---|---|---|
| 5,399,900 | A | * | 3/1995 | Ko et al. | 257/607 |
| 6,171,945 | B1 | * | 1/2001 | Mandal et al. | 438/622 |
| 6,403,474 | B1 | * | 6/2002 | Avanzino et al. | 438/660 |

* cited by examiner

Primary Examiner—Ngân V. Ngô

(57) ABSTRACT

A solid state electronic device consists of a bottom electrode (10) and a top electrode (20) with a dielectric layer (30) sandwiched in between. In one example, the dielectric layer is aluminum oxide. Microscopic voids or pinholes (40) in the aluminum oxide layer are filled with an electrically nonconductive material (50) to prevent current leakage between the two electrodes, and the addition of the electrically nonconductive material increases the performance of the device. The electrically nonconductive material can be p-nitroaniline, polyvinyl phenol, epoxy, polyurethane, polyacrylate, polyvinyl alcohol, titanium dioxide, barium titanate, oxides of aluminum, and oxides of silicon.

27 Claims, 2 Drawing Sheets

ELECTRONIC DEVICE HAVING A FILLED DIELECTRIC MEDIUM

This invention was made with United States Government support under Agreement No. 70NANB0H3033 awarded by the National Institute of Standards and Technology (NIST). The United States Government has certain rights in the invention.

FIELD OF THE INVENTION

This invention relates generally to electronic devices. More particularly, this invention relates to electronic devices comprising a filled dielectric interspersed between two electrodes.

BACKGROUND OF THE INVENTION

Electronic devices such as capacitors and field effect transistors typically have a dielectric layer interspersed between two or more electrodes. It is well established that a pinhole-free dielectric is critical for proper device performance and reliability, and much work has been published in the prior art to insure that the dielectric layers are of the highest quality. Field effect transistors (FETs) are transistors in which the resistance of the current path from source to drain is modulated by applying a transverse electric field between grid or gate electrodes. The electric field varies the thickness of the depletion layer between the gates, thereby modifying the conductance. An FET as generally practiced in the prior art has a gate electrode situated on a substrate, a gate dielectric layer is disposed on the gate electrode, a semiconductor layer used as an active layer of the transistor is formed on the gate dielectric layer, and source and drain electrodes are formed on the semiconductor layer. Organic field effect transistors (OFETs) utilize an organic semiconductor layer, such as polythiophene compounds, in place of conventional inorganic semiconducting materials. Capacitors employ a variety of different types of dielectric materials layered between two electrodes to achieve the desired capacitance. Usually, the layering of electrode and dielectric is repeated numerous times to create a multilayered structure. In both these devices, any pinholes, voids, or apertures in the dielectric layer would obviously impair the performance of the device by allowing electric current to leak between the various electrodes, and further, in FETs and OFETs, these voids create channels that the semiconductor and/or the conducting electrode can diffuse into, so painstaking effort and significant expense is expended to insure that the dielectric layers are as pinhole-free and as nearly perfect as possible. It would be a significant contribution to the art if electronic devices could be made using dielectric layers that have voids or pinholes in them and still maintain the low cost and extremely high quality and reliability that we have come to expect.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
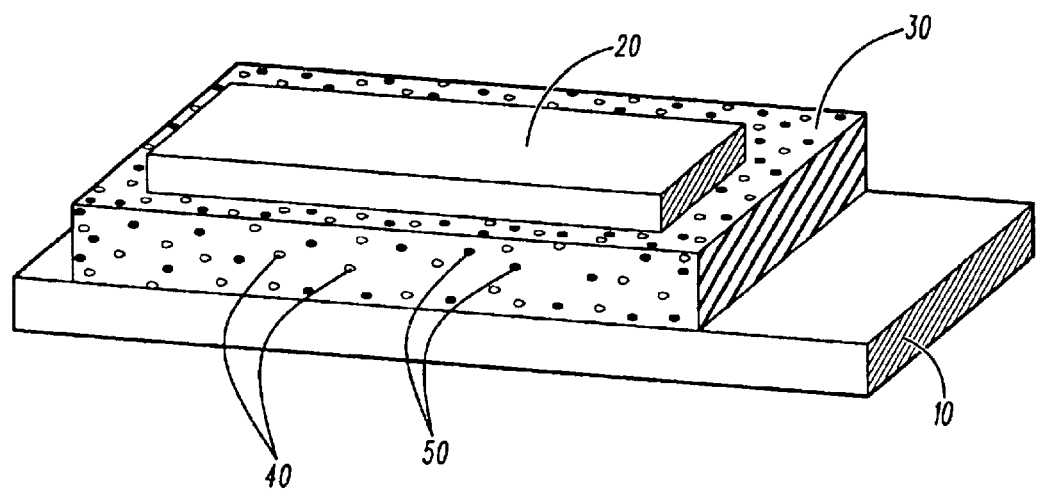
FIG. 1 is a partial perspective view of an electronic device in accordance with the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding elements in the several views of the drawings. A solid state electronic device consists of a bottom electrode and a top electrode with a dielectric layer sandwiched in between. In one example, the dielectric layer is aluminum oxide. Microscopic voids or pinholes in the aluminum oxide layer are filled with an electrically nonconductive material to prevent current leakage between the two electrodes, and the addition of the electrically nonconductive material increases the performance of the device. The electrically nonconductive material can be p-nitroaniline, polyvinyl phenol, epoxy, polyurethane, polyacrylate, polyvinyl alcohol, titanium dioxide, barium titanate, oxides of aluminum, or oxides of silicon.

Referring now to FIG. 1, a solid state electronic device, such as a capacitor or a field effect transistor, typically has a first electrode 10 and a second electrode 20 with a dielectric material 30 disposed between them. In prior art devices, copious effort is expended to insure that the dielectric layer 30 is free of any voids, pinholes, pores, or apertures 40, because these imperfections impair the performance of the device by allowing electric current to leak between the electrodes 10, 20. The size of the voids can vary from several nanometers to hundreds of microns, and for purposes of our invention, we will use the term 'microscopic' herein to describe this entire range of void sizes, indicating that the voids are, indeed very small. Obviously, a dielectric containing voids has a different dielectric constant than one without voids, thus the device performance will likewise be different. Some dielectrics, for example, metal oxides such as anodized aluminum (aluminum oxide), inherently have voids of 70 nanometers or more, which is undesirable for a dielectric layer in an organic field effect transistor. It creates channels that the semiconductor and/or conductor layers can diffuse into, resulting in current leakage or complete destruction of the dielectric film. In contrast to prior art devices, we have found that if these voids 40 are properly filled with a suitable dielectric material 50, they can be effectively closed to form a heterogeneous solid material that has uniform bulk dielectric properties. The filler not only seals the voids, it allows one to in-situ manipulate the dielectric properties of the metal oxide. Two criteria were used to select fillers for use with oxide films. First, the fillers should be solution processable. By that, we mean that they should either be in liquid form at the temperature of incorporation into the dielectric voids, or be capable of being dissolved or suspended in a suitable carrier solvent to form a liquid or suspension. Second, the filler should have dielectric properties that would enhance, or at least not degrade, the dielectric properties of the material that they are being diffused into, such as a high dielectric constant. Examples of materials that we have found suitable include, but are not limited to, p-nitroaniline, polyvinyl phenol, epoxy, polyurethane, polyacrylate, polyvinyl alcohol, titanium dioxide, barium titanate, oxides of aluminum, and oxides of silicon.

EXAMPLE 1

A dielectric solution is prepared by dissolving p-nitroaniline (dielectric constant 56.3) in ethanol. A coupon of aluminum that has been anodized to form an aluminum oxide coating is cleaned and then heated at 100° C. for 5 minutes to remove any residual moisture from the surface of the coating and also to remove any water that has been absorbed into the voids or pores in the aluminum oxide. The coupon is then dipped in the p-nitroaniline/ethanol solution for 5 minutes so that the p-nitroaniline filler can migrate into the voids in the aluminum oxide coating. The coupon is then dried at 22° C. for 30 minutes, or alternatively, at 50° C. for 5 minutes to remove the ethanol carrier solvent.

EXAMPLE 2

Figure 2:
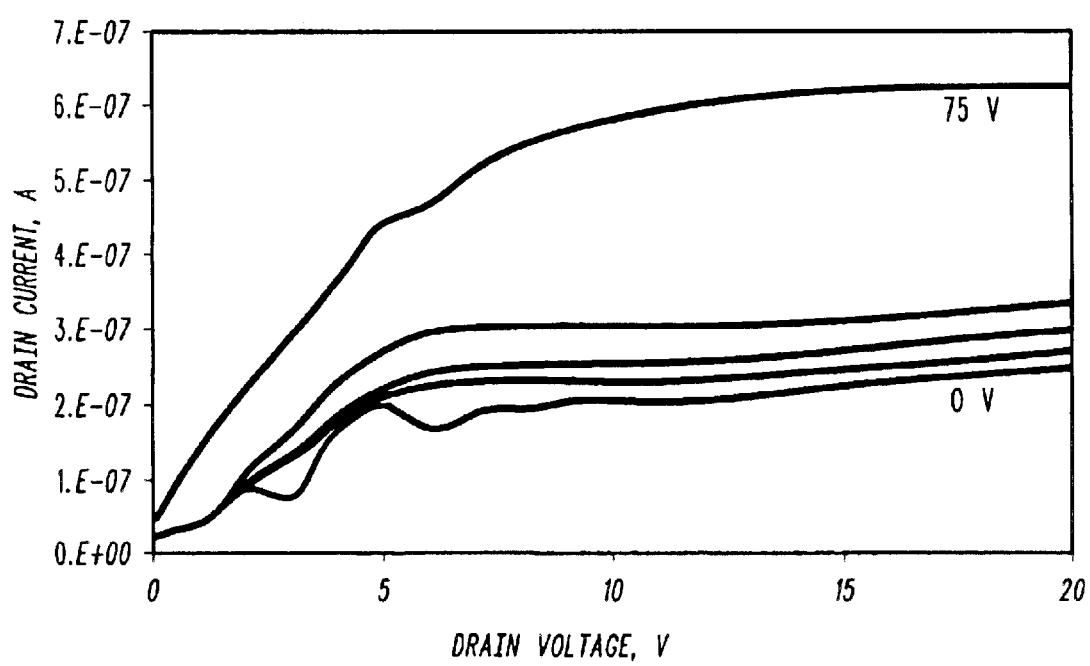
FIG. 2 is a current-voltage plot of an n-type organic semiconductor dispersion on a polyvinyl phenol filled anodized aluminum oxide dielectric layer, consistent with certain embodiments of the present invention.

A dielectric solution is prepared by dissolving polyvinyl phenol (PVP) (dielectric constant approximately 2.5) in isopropanol. A coupon of aluminum that has been anodized to form an aluminum oxide coating is cleaned and then heated at 100° C. for 5 minutes to remove any residual moisture from the surface of the coating and also to remove any water that has been absorbed into the voids or pores in the aluminum oxide. The coupon is then dipped in the PVP/isopropanol solution for 5 minutes so that the PVP filler can migrate into the voids in the aluminum oxide coating. The coupon is then dried at 22° C. for 30 minutes, or alternatively, at 50° C. for 5 minutes to remove the isopropanol carrier solvent. The leakage current was measured and an IV (current-voltage) plot was made, and the results are presented in FIG. 2. The leakage current was reduced by six orders of magnitude.

Although we have described and shown examples of aluminum oxide films being filled with organic dielectric materials, other metals such as lithium, beryllium, sodium, magnesium, aluminum, silicon, potassium, calcium, scandium, titanium, vanadium, chromium, manganese, iron, cobalt, nickel, copper, zinc, indium, tin, antimony, tantalum, tungsten, lead, and bismuth also form oxides, and these oxides can likewise be employed. Additionally, polymers also possess the requisite properties to perform as a dielectric, and can be used in place of metal oxide films. The phenomena of pinhole or void formations is also found in polymer films, and just as in the above examples of aluminum oxide films, the voids in polymer films can be effectively filled with an electrically nonconductive material to enhance device performance. Some useful polymers include, but are not limited to, polyimides, polyesters, polyamides, polyester-imides, polyethylenes, polyacrylates, polybutyrates, polypropylenes, and polytetrafluoroethylenes. Most commonly, the electrodes in the capacitor and the field effect transistor are metal, but in other embodiments of the invention, polymers that are filled with metal particles to render them conductive, or unfilled polymers that are inherently conductive, can be substituted for the metal in the top and/or bottom electrodes.

Figure 3:
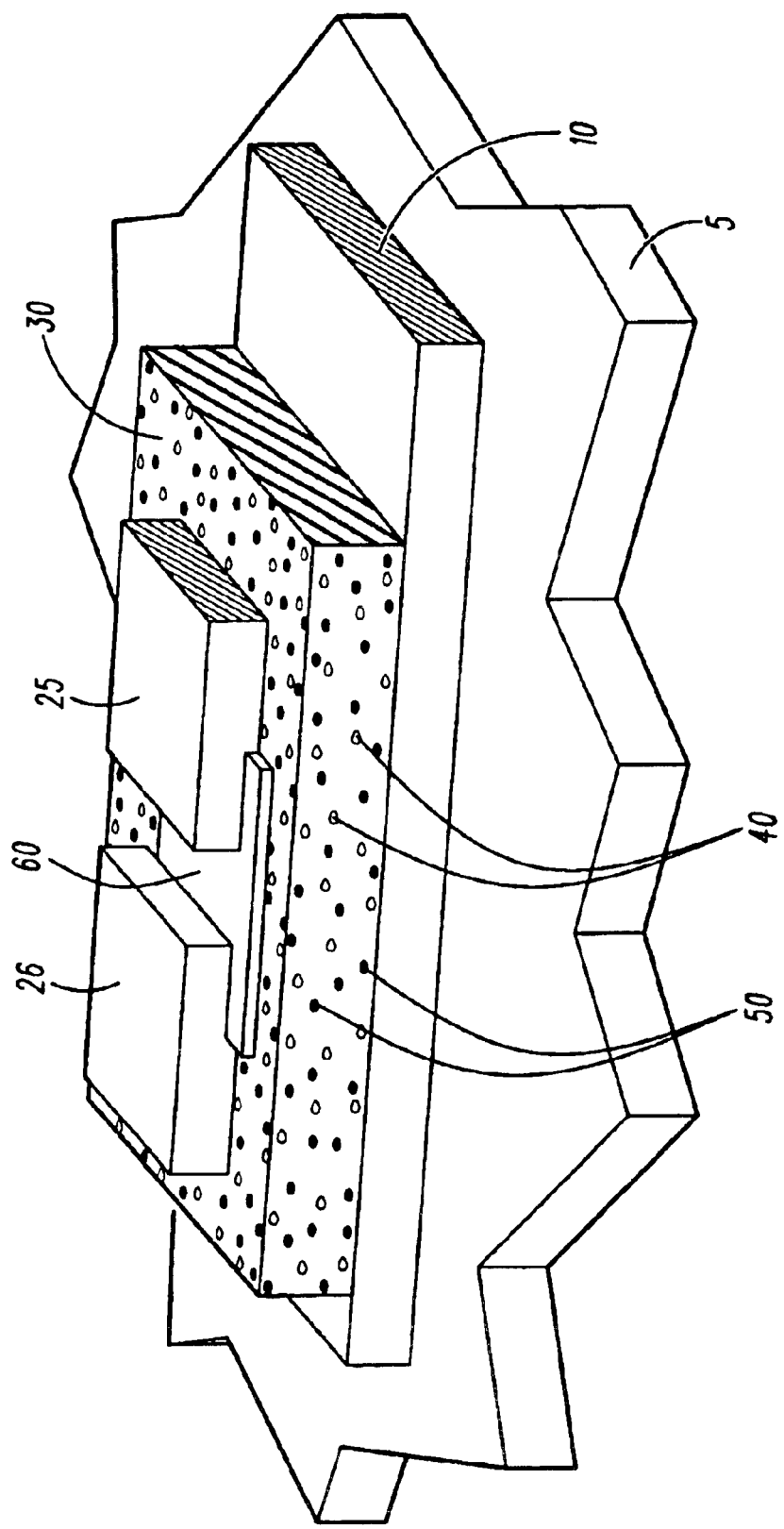
FIG. 3 is a partial perspective view of a field effect transistor consistent with certain embodiments of the present invention.

In an another embodiment of the invention depicted in FIG. 3, a field effect transistor is formed by disposing a gate electrode 10 on a suitable substrate 5, and a gate dielectric layer 30 on the gate electrode. A semiconductor layer 60 used as an active layer of the transistor is formed on the gate dielectric layer 30, and source and drain electrodes 25 and 26 are formed to lie at least partially on the dielectric layer 30 and at least partially on the semiconductor layer 60. The gate electrode is typically formed in the transistor by depositing Cr/Au or Ti/Au, and the thickness of the gate electrode is typically about 1000 Angstroms. On the gate electrode in the transistor region, the dielectric layer 30 that insulates the gate electrode from other members is made of an electrically non-conducting substance, such as the metal oxides and polymers outlined above. The pores or voids 40 in the dielectric layer 30 are filled with an electrically nonconducting material 50 sufficient to prevent electrical signal conduction through the dielectric layer from the gate electrode to the source or drain electrodes. Suitable materials for filling the pores are p-nitroaniline, polyvinyl phenol, epoxy, polyurethane, polyacrylate, polyvinyl alcohol, titanium dioxide, barium titanate, oxides of aluminum, and oxides of silicon. The organic semiconductor layer is deposited by a solution process e.g. spin coating, gravure, flexography, soft lithography or vacuum deposition method. Preferably, the thickness of the semiconductor layer is less than 1000 nm. A gold film with high electrical conductivity is typically deposited over the dielectric and semiconducting layers and etched to form the source and drain electrodes.

In yet another embodiment of the invention, a field effect transistor is formed using a combination of solution processes. As an example, the gate electrode is typically formed in the transistor by depositing copper using print and etch methods as known in the printed wiring board art. On the gate electrode in the transistor region, the dielectric layer 30 that insulates the gate electrode from other members is made of an electrically non-conducting substance and is deposited using a printing process such as flexography, gravure, soft lithography, or ink jet. The pores or voids 40 in the dielectric layer 30 are filled with an electrically nonconducting material 50 sufficient to prevent electrical signal conduction through the dielectric layer from the gate electrode to the source or drain electrodes. Suitable materials for filling the pores are p-nitroaniline, polyvinyl phenol, epoxy, polyurethane, polyacrylate, polyvinyl alcohol, titanium dioxide, barium titanate, oxides of aluminum, and oxides of silicon. The source and drain electrodes are formed via a printing process e.g. gravure, flexography, soft lithography, ink jet. The organic semiconductor layer is deposited by a solution process e.g. spin coating or a printing process e.g. gravure, flexography, soft lithography, ink jet. In summary, without intending to limit the scope of the invention, a solid state electronic device in accordance with certain embodiments of the invention can be created by sandwiching a dielectric layer such as aluminum oxide in between a bottom electrode and a top electrode, and filling the voids in the dielectric layer with an electrically nonconductive material to prevent current leakage between the two electrodes. The filled voids mitigate leakage of the electric signal from the bottom electrode to the top electrode, or vice versa. Those skilled in the art will recognize that the present invention has been described in terms of exemplary embodiments based upon use of anodized aluminum as the dielectric material. However, the invention should not be so limited, since other variations will occur to those skilled in the art upon consideration of the teachings herein. Solid state electronic devices encompass not only those having inorganic dielectrics, but include those incorporating polymers as a dielectric medium. While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A solid state electronic device, comprising:
    a first electrode;
    a dielectric layer deposited on at least a portion of the first electrode, said dielectric layer having a plurality of microscopic voids therein;
    a second electrode, deposited on at least a portion of the dielectric layer; and
    wherein at least a portion of the plurality of microscopic voids in the dielectric layer are filled with an electrically nonconductive material sufficient to prevent electrical conduction through the dielectric layer from the first electrode to the second electrode.

2. The solid state electronic device as described in claim 1, wherein the first electrode is metal.

3. The solid state electronic device as described in claim 1, wherein the second electrode is metal.

4. The solid state electronic device as described in claim 1, wherein the first electrode is a conductive polymer.

5. The solid state electronic device as described in claim 1, wherein the first electrode is a metal filled polymer.

6. The solid state electronic device as described in claim 1, wherein the second electrode is a conductive polymer.

7. The solid state electronic device as described in claim 1, wherein the second electrode is a metal filled polymer.

8. The solid state electronic device as described in claim 1, wherein the dielectric layer is a metal oxide.

9. The solid state electronic device as described in claim 8, wherein the metal oxide is an oxide of one or more metals selected from the group consisting of lithium, beryllium, sodium, magnesium, aluminum, silicon, potassium, calcium, scandium, titanium, vanadium, chromium, manganese, iron, cobalt, nickel, copper, zinc, indium, tin, antimony, tantalum, tungsten, lead, and bismuth.

10. The solid state electronic device as described in claim 1, wherein the dielectric layer is a polymer.

11. The solid state electronic device as described in claim 1, wherein the electrically nonconductive material is one or more materials selected from the group consisting of p-nitroaniline, polyvinyl phenol, epoxy, polyurethane, polyacrylate, polyvinyl alcohol, titanium dioxide, barium titanate, oxides of aluminum, and oxides of silicon.

12. The solid state electronic device as described in claim 1, wherein the solid state electronic device is selected from the group consisting of capacitors, semiconducting wafers, and field effect transistors.

13. A solid state electronic device, comprising:
    a first electrode;
    a polymeric dielectric layer deposited on at least a portion of the first electrode, said polymeric dielectric layer having a plurality of microscopic voids therein;
    a second electrode, deposited on at least a portion of the polymeric dielectric layer; and
    wherein at least a portion of the plurality of microscopic voids in the polymeric dielectric layer are filled with an electrically nonconductive material selected from the group consisting of p-nitroaniline, polyvinyl phenol, epoxy, polyurethane, polyacrylate, polyvinyl alcohol, titanium dioxide, barium titanate, oxides of aluminum, and oxides of silicon, sufficient to prevent electrical conduction through the polymeric dielectric layer from the first electrode to the second electrode.

14. The solid state electronic device as described in claim 13, wherein the first and second electrodes are metal.

15. The solid state electronic device as described in claim 13, wherein the first and second electrodes are a conductive polymer.

16. The solid state electronic device as described in claim 13, wherein the filled polymeric dielectric layer exhibits uniform bulk dielectric properties.

17. The solid state electronic device as described in claim 13, wherein the filled polymeric dielectric layer is heterogeneous.

18. A solid state electronic device, comprising:
    a first electrode;
    a metal oxide layer selected from the group consisting of oxides of lithium, beryllium, sodium, magnesium, aluminum, silicon, potassium, calcium, scandium, titanium, vanadium, chromium, manganese, iron, cobalt, nickel, copper, zinc, indium, tin, antimony, tantalum, tungsten, lead, and bismuth, deposited on at least a portion of the first electrode, said metal oxide layer having a plurality of microscopic voids therein;
    a second electrode, deposited on at least a portion of the metal oxide layer; and
    wherein at least a portion of the plurality of microscopic voids in the metal oxide layer are filled with an electrically nonconductive material selected from the group consisting of p-nitroaniline, polyvinyl phenol, epoxy, polyurethane, polyacrylate, polyvinyl alcohol, titanium dioxide, barium titanate, oxides of aluminum, and oxides of silicon, sufficient to prevent electrical conduction through the metal oxide layer from the first electrode to the second electrode.

19. The solid state electronic device as described in claim 18, wherein the first and second electrodes are metal.

20. The solid state electronic device as described in claim 18, wherein the first and second electrodes are a conductive polymer.

21. The solid state electronic device as described in claim 18, wherein the electrically nonconductive material is deposited in the microscopic voids from a solution of the dielectric in a carrier solvent.

22. The solid state electronic device as described in claim 18, wherein the filled metal oxide layer is heterogeneous.

23. The solid state electronic device as described in claim 18, wherein the filled metal oxide layer exhibits uniform bulk dielectric properties.

24. The solid state electronic device as described in claim 18, wherein the dielectric constant of the electrically nonconductive material is greater than the dielectric constant of the metal oxide.

25. A solid state electronic device, comprising:
    a first electrode deposited on a substrate;
    an aluminum oxide layer deposited on at least a portion of the first electrode, said aluminum oxide layer having a plurality of microscopic voids therein;
    a second electrode, deposited on at least a portion of the aluminum oxide layer; and
    wherein at least a portion of the microscopic voids in the aluminum oxide are filled with an electrically nonconductive material selected from the group consisting of p-nitroaniline, polyvinyl phenol, epoxy, polyurethane, polyacrylate, polyvinyl alcohol, titanium dioxide, barium titanate, oxides of aluminum, and oxides of silicon, sufficient to prevent electrical conduction through the aluminum oxide layer from the first electrode to the second electrode.

26. A field effect transistor, comprising:

a gate electrode deposited on a substrate;

an aluminum oxide layer deposited on at least a portion of the gate electrode, said aluminum oxide layer having a plurality of microscopic voids therein;

source and drain electrodes, deposited on at least a portion of the aluminum oxide layer; and wherein at least some of the microscopic voids in the aluminum oxide layer are filled with an electrically nonconductive material sufficient to prevent electrical conduction through the aluminum oxide layer from the gate electrode to the source and drain electrodes.

27. The solid state electronic device as described in claim 26, wherein the electrically nonconductive material is one or more materials selected from the group consisting of p-nitroaniline, polyvinyl phenol, epoxy, polyurethane, polyacrylate, polyvinyl alcohol, titanium dioxide, barium titanate, oxides of aluminum, and oxides of silicon.

* * * * *